United States Patent [19]

Okada et al.

[11] Patent Number: 5,455,081
[45] Date of Patent: Oct. 3, 1995

[54] PROCESS FOR COATING DIAMOND-LIKE CARBON FILM AND COATED THIN STRIP

[75] Inventors: Morihiro Okada, Kawasaki; Kiyoshi Yoshikawa, 25, Soomon-cho, Kinugasa, Kita-ku, Kyoto-shi, Kyoto; Yasushi Yamamoto, Room 11-408, Kyoto University Staff Official Residence; Hisayuki Toku, Room 554, Kyoto Universiy Staff Official Resicence, both of Gokasho, Uji-shi, Kyoto, all of Japan

[73] Assignees: Nippon Steel Corporation, Tokyo; Yoshikawa; Kiyoshi, Kyoto; Yamamoto; Yasushi, Kyoto; Toku; Hisayuki, Kyoto, all of Japan

[21] Appl. No.: 197,018

[22] Filed: Feb. 15, 1994

Related U.S. Application Data

[63] Continuation of Ser. No. 764,887, Sep. 24, 1991, abandoned.

[30] Foreign Application Priority Data

Sep. 25, 1990 [JP] Japan ..................... 2-254756
May 22, 1991 [JP] Japan ..................... 3-117735

[51] Int. Cl.$^6$ ............................. B05D 3/06; B01J 3/06; C23F 1/00
[52] U.S. Cl. ................. 427/528; 427/530; 427/523; 427/562; 423/446; 216/66
[58] Field of Search ..................... 427/528, 523, 427/524, 530, 534, 539, 562; 204/192.34, 192.35; 423/446; 156/643

[56] References Cited

U.S. PATENT DOCUMENTS

| | | | |
|---|---|---|---|
| 3,961,103 | 6/1976 | Aisenberg | 427/577 |
| 4,490,229 | 12/1984 | Mirtich et al. | 204/192.15 |
| 4,541,890 | 9/1985 | Cuomo et al. | 156/345 |
| 4,703,222 | 10/1987 | Yoshikawa et al. | 313/362.1 |

(List continued on next page.)

FOREIGN PATENT DOCUMENTS

| | | |
|---|---|---|
| 59-174508 | 10/1984 | Japan . |
| 60-145994 | 8/1985 | Japan . |
| 61-272363 | 12/1986 | Japan . |
| 62-67174 | 3/1987 | Japan . |
| 63-123802 | 5/1988 | Japan . |
| 162213 | 3/1989 | Japan . |
| 162457 | 3/1989 | Japan . |

(List continued on next page.)

OTHER PUBLICATIONS

Lerner & Trigg, ed. *Encyclopedia of Physics*, "Nuclear Magnetic Resonance" by Walstedt pp. 831–833; 2nd edition, 1991 (no month).
Japanese abstract of 60–5882 by Noribumi Kikuchi et al Pub May 16, 1985.
K, Yoshikawa et al., Report of Research Project, No translation Grant–in Aid for Fusion Research, The Ministry of Education, Science and Culture, Mar. 1987.
K, Yoshikawa et al. Proc, 11th Symp. on ISIAT'87, Tokyo, pp. 129–132 (1987) Jun.
E. A. Pinsley and C. O. Brown, Journal of Spacecraft and Rockets, vol. 1. P. 525, Sep. 1964.
A. I. Morozov, A. Ya. kislov and I. P. Zubkov, Sov. Phys. TSTPLETT. No. 7, pp. 172–174, 1968.

*Primary Examiner*—Marianne Padgett
*Attorney, Agent, or Firm*—Kenyon & Kenyon

[57] ABSTRACT

A process for coating a substrate surface with a diamond-like carbon film, in which a starting material gas comprising a hydrocarbon compound is introduced into a Hall accelerator ion source with an inner pressure thereof reduced to $1\times10^{-5}$ to $1\times10^{-1}$ Torr, an ion beam in which 80 % or more of the ion beams formed have an impinging energy in the range of 100 to 1500 eV is formed in the ion source, and irradiated onto a substrate comprising various kinds of materials in a vacuum chamber, to thereby coat the substrate surface with a diamond-like carbon film with a strong adhesion to an extent such that is can with stand practical application.

13 Claims, 4 Drawing Sheets

U.S. PATENT DOCUMENTS

| | | | |
|---|---|---|---|
| 4,795,656 | 1/1989 | Mizoguchi et al. | 204/192.31 |
| 4,839,195 | 6/1989 | Kitamura et al. | 427/38 |
| 4,862,032 | 8/1989 | Kaufman et al. | 313/359.1 |
| 4,915,979 | 4/1990 | Ishida et al. | 427/575 |
| 4,919,779 | 4/1990 | Mizoguchi et al. | 427/38 |
| 4,933,058 | 6/1990 | Bach et al. | 204/192.3 |
| 5,064,682 | 11/1991 | Kiyama et al. | 427/530 |
| 5,094,878 | 3/1992 | Yamamoto et al. | 427/562 |
| 5,185,067 | 2/1993 | Shibahara et al. | 427/523 |
| 5,192,523 | 3/1993 | Wu et al. | 427/523 |

FOREIGN PATENT DOCUMENTS

| | | |
|---|---|---|
| 165092 | 3/1989 | Japan . |
| 179371 | 3/1989 | Japan . |
| 197839 | 4/1989 | Japan . |
| 1147067 | 6/1989 | Japan . |
| 1162757 | 6/1989 | Japan . |
| 1167211 | 6/1989 | Japan . |
| 2122075 | 5/1990 | Japan . |
| 2196095 | 8/1990 | Japan . |
| 2274876 | 11/1990 | Japan . |

PROCESS FOR COATING DIAMOND-LIKE CARBON FILM AND COATED THIN STRIP

This application is a continuation of application Ser. No. 07/764,887 filed Sep. 24, 1991 now abandoned.

BACKGROUND OF THE INVENTION

1. Field of the Invention

This invention relates to a process for coating a diamond-like carbon film on the surface of various materials and a thin strip coated by this process.

2. Description of the Related Art

A diamond-like carbon film can be formed according to the CVD (Chemical Vapor Deposition) gas phase growth methods such as disclosed in Japanese Unexamined Patent Publications (Kokai) Nos. 61-272363, 62-67174, 63-123802, 1-167211, and 2-196095. According to these processes, although a coating with an adhesive force strong enough to stand practical application for limited materials such as tungsten carbide, etc., is possible, it is difficult to coat a diamond-like carbon film onto various materials such as iron type materials, ceramics, and plastics with an adhesive force strong enough to with stand a practical application.

Accordingly, to improve this adhesive force of diamond-like carbon film, techniques have been developed in which an element which can readily form a carbide is deposited as the intermediate layer on the surface of a substrate made of a material with a weak adhesion to a diamond-like carbon film (Japanese Unexamined Patent Publications (Kokai) Nos. 61-163273, 64-62213, 64-62457, 64-65092, 64-79371, 1-147067). Nevertheless, although the adhesion to diamond-like carbon film could be improved by such methods, due to increased material and production costs, they have not been adopted for the industrial production of materials composed primarily of iron.

Prior arts have enabled a thin film having a thickness of 100 μm or less from the thickness of one atom layer to be formed and utilized in the semiconductor industries and semiconductor researches. In the field of semiconductor materials, however, it is necessary to remove defects on the atomic order (presence of unintended impurities, distortion on the atomic order), which have an adverse influence on the motion of electrons in the material, as much as possible, and consequently, for the formation of a thin film in the semiconductor field, there is used a dry process which can effect a film formation with gas molecules or a plasma excited species having as small as possible kinetic energy, i.e., some 10 eV or less. Such a technical concept has been erroneously applied to the forming of a diamond-like carbon film, and therefore, most researchers have practiced the formation of diamond-like carbon films according to the CVD method, and thus ultimately were able only to obtain a diamond-like carbon film with a weaker adhesive force, compared with one obtained by the PVD method.

The techniques for forming a diamond-like carbon film by the PVD (Physical Vapor Deposition) method are disclosed in Japanese Unexamined Patent Publications (Kokai) Nos. 59-174508, 60-145994, 1-097839, 2-274876. In these methods, for substrates composed mainly of materials which can readily form carbides of, for example, silicon, tungsten, and chromium, etc., diamond-like carbon films can be coated with stronger adhesive force than by the CVD method, but for materials composed mainly of iron, the coating still has only a weak adhesive force. For example, if a diamond-like carbon film is directly formed on pure iron by using a Kaufman type ion source, when the sample film after formation is taken out of the vacuum chamber and into the air, it has an adhesive force only to an extent such that a part of the film is easily peeled off due to the pressure of moisture in the air, and when the portion not peeled off is scratched with the tip of a pincette, that portion is also easily peeled off. Therefore the adhesive force obtained can not withstand industrial use. To solve this problem, there have been developed a method of ion injecting carbon atoms onto from the substrate surface of an iron type material, or causing a penetration of carbon atoms by a method such as thermal diffusion, and coating a diamond-like carbon film thereon by the PVD method (Japanese Unexamined Patent Publications (Kokai) Nos. 1-162757 and 2-122075). Such methods, however, did not give a sufficient improvement of the adhesion of a diamond-like carbon film to an iron type substrate.

SUMMARY OF THE INVENTION

Therefore, an object of the present invention is to provide a process for coating the surface of substrates composed of various materials, particularly a material composed mainly of iron, with a diamond-like carbon film having a strong adhesive force thereto and able to with-stand practical application.

Another object of the present invention is to form a diamond-like carbon film with a strong adhesive force by an industrially applicable means.

Another object of the present invention is to provide a shiny strip particularly of an amorphous magnetic alloy, coated with a diamond-like carbon film having a strong adhesion thereto.

To accomplish the above objects, the present inventors made an intensive study of the problems, and consequently, found that, for the formation of a diamond-like carbon film having a high hardness and good adhesiveness, the following two points:

(1) accumulating internal stress in the film through a wedge effect obtained by an implantation of high speed ions during the film formation; and (2) strengthening the adhesion of the film to the substrate to an extent such that the film will not be peeled off even under severe internal stress are important, and that ions or particles with a high motion energy are necessary therefor. The inventors also reached the conclusion that, as a film forming device for accomplishing this purpose, a device using the PVD method, i.e., an ion gun type capable of accelerating ions, is better than a device using the CVD method.

The ion beam device of the prior art, however, has a structure in which filaments and a plurality of grids, etc., are complexly arranged in a small space internally of the ion gun, and accordingly, when operated to withdraw an ion beam having a large capacity and suitable for forming a film by introducing a hydrocarbon gas, etc., which becomes the starting material for forming a diamond-like carbon film, electroconductive soot is deposited on all internal parts of the ion gun, and this destroys the insulation of insulated parts supporting the filaments or grids, to thereby make the ion gun instantly unusable. In the case of the CVD device, the method of providing a removable plate on the wall of the space where a plasma exists, and exchanging the plate when it becomes contaminated, and the method of internally sweeping the device by irradiating a plasma of a gas which will remove contamination by etching, have been employed to combat such contamination. The method of providing a removable plate, however, is not feasible internally of the ion gun. Further, a gas which is effective for a high speed etching of soot, such as oxygen, has a high corrosiveness, and when such gas is introduced into the ion gun of the prior art, the fine metal parts will be corroded and oxidized and the device will immediately break down.

Accordingly, the present inventors paid special attention to the PVD method using a Hall accelerator, which has not been studied with regard to thin film producing techniques because the ion beam has a high kinetic energy, even though it is a dry process, and found that the motion or kinetic energy has a broad energy distribution, and the ions with a high energy and the ions with a low energy respectively play very important roles in the attaching of a diamond-like carbon film, to thereby accomplish the present invention.

Since the Hall accelerator has a simple discharging space structure, it is very easy to successfully form a diamond-like carbon film while suppressing a generation of soot during the operation of, for example, alternately irradiating the methane gas ion beam and the oxygen gas ion beam.

In the above-mentioned Hall accelerator, there are no portions susceptible to consumption, such as filaments, etc., which in the prior art break down in relatively short time, and therefore, it can continue to continuously emit high speed particles for a long time, and can extract ten times or more an ion current than can be extracted by using the ion source usually utilized in the field of semiconductors, and therefore, has been investigated for use as an ion engine for astronautical purposes (E. A. Pinsley and C. O. Brown, Journal of Spacecraft and Rockets, Vol. 1, p. 525, September 1964).

Also, since the residence time of electrons in the acceleration region is long, in actuation principle, and the electrons have the effect of neutralizing the positive space charges of the ions in the discharging space, a beam having a very large current not restricted by space charges is withdrawn, and therefore, this device has been investigated for use as the supply source providing a start up plasma for fusion reactors (A. T. Morozov, A. Ya. Kislov and I.p. Subkov, Sov. Phys. JETP LETT. NO. 7, p. 172–174, 1968).

The present inventors have studied this device not only from such a technical point of view, but also from the viewpoint of material development, and thus developed a Hall type ion source which can be used as an ion injection and sputtering source (K. Yoshikawa et al., Report of Research Project, Grant-in-Aid for Fusion Research, Ministry of Education, Science and Culture, March, 1987). The Hall type ion source used by the present inventors in the above research can withdraw an ion beam having a pulse of about 10 keV. Further, the present inventors have newly developed a Hall accelerator in low voltage CW operation (hereinafter called HALOC) which can continuously withdraw an ion beam having an energy of 0 to 1000 eV, for one hour or longer (K. Yoshikawa et al., Proc. 11th Symp. on ISIAT '87, Tokyo, pp. 129–132, 1987).

The present inventors made further research into the HALOC, and thus successfully formed a diamond-like carbon film having an improved adhesiveness.

DESCRIPTION OF THE PREFERRED EMBODIMENTS

The present inventors made a detailed investigation of the ion beam obtained as a result of the research described above into HALOC, and consequently made the following findings in connection with diamond-like carbon films.

Figure 1:
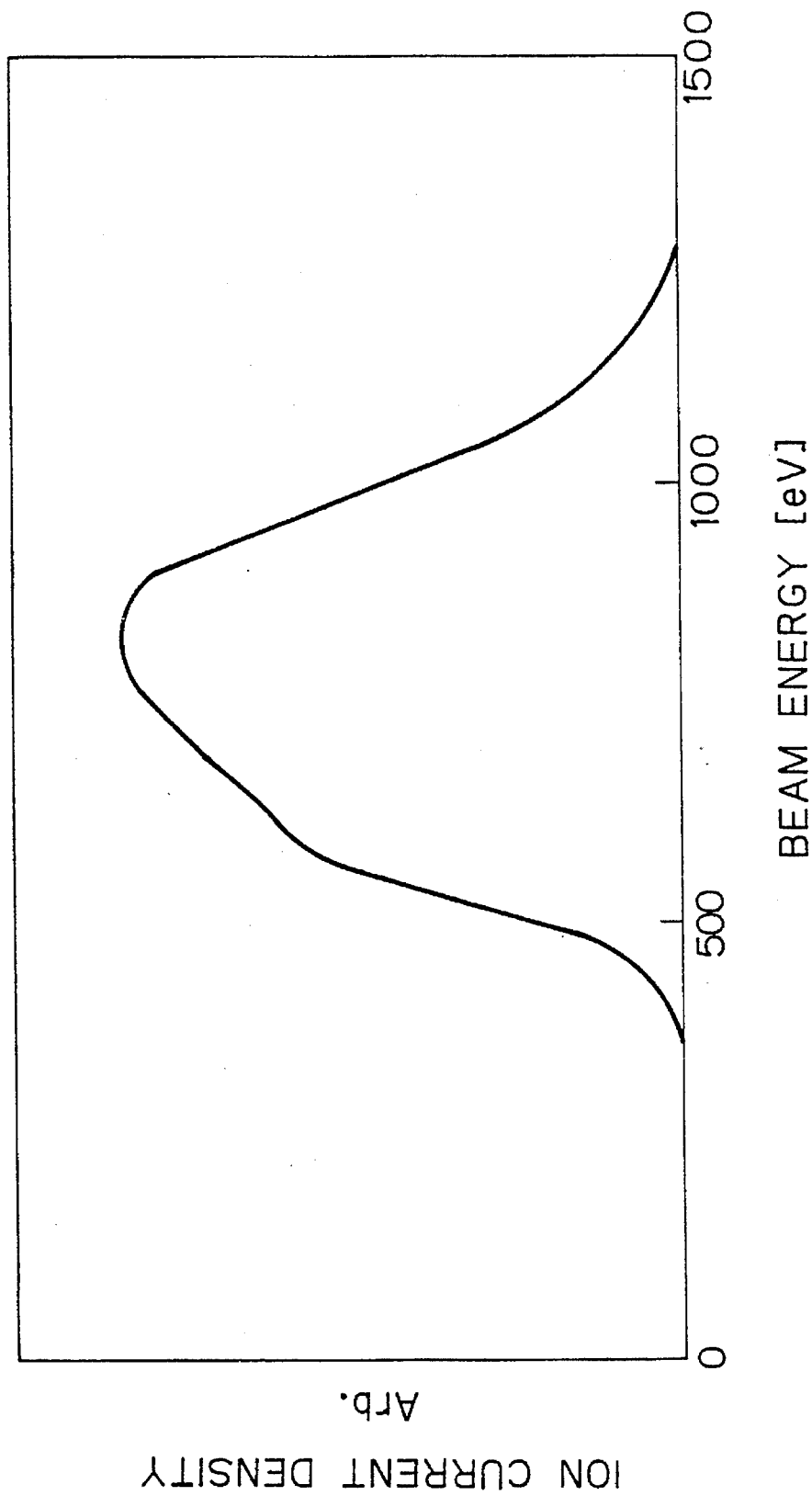
FIG. 1 is a graph showing the relationship between the ion current density and beam energy in the HALOC to be used in the present invention.

FIG. 1 shows an example of the energy distribution of the ion beam irradiated from HALOC. The irradiation conditions were as follows:

Discharge voltage: 1000 V

Discharge current: 1 A

Methane gas pressure: $3.5 \times 10^{-3}$ Torr.

As shown in the same Figure, the beam energy has a broad distribution in the range of 400 to 1200 eV, and the ions of 1000 eV or higher contribute to the formation of a layer of a slanted material migrated from the substrate material to the diamond-like carbon, at the interface between the film and the substrate at the initial stage of the film formation, and then play a role in causing the film to be implanted like a wedge in the diamond-like carbon film. The ions having energies from 500 eV to 1000 eV play a role in the deposition on the substrate when forming a film, and ions with a low energy play a role of withdrawing hydrogen atoms from the film surface to thus control the hydrogen content of the film, whereby the structure of the diamond-like carbon film is determined. Therefore, to form a diamond-like carbon film having a strong adhesion to the substrate, and a high hardness and excellent various physical properties such as electrical insulation or solid lubricity, etc., it is necessary to properly control the balance of the energy distribution of the ion beams irradiated during the film formation. As the minimum conditions, it is necessary to make the total of the amount of the ion beam with an energy smaller than 100 eV and the amount of the ion beam with an energy higher than 1500 eV smaller than 20% of the total ion beams. Namely, the present invention requires ion beams having kinetic motion energies in the range of 100 to 1500 eV, preferably 500 to 1300 eV, at a ration of 80% or more of the total ion beam amount.

The present invention was accomplished by finding that the ion beam of HALOC, which has not been studied as a thin film coating technique, provides an extremely important phenomenon when forming a diamond-like carbon film.

Figure 2:
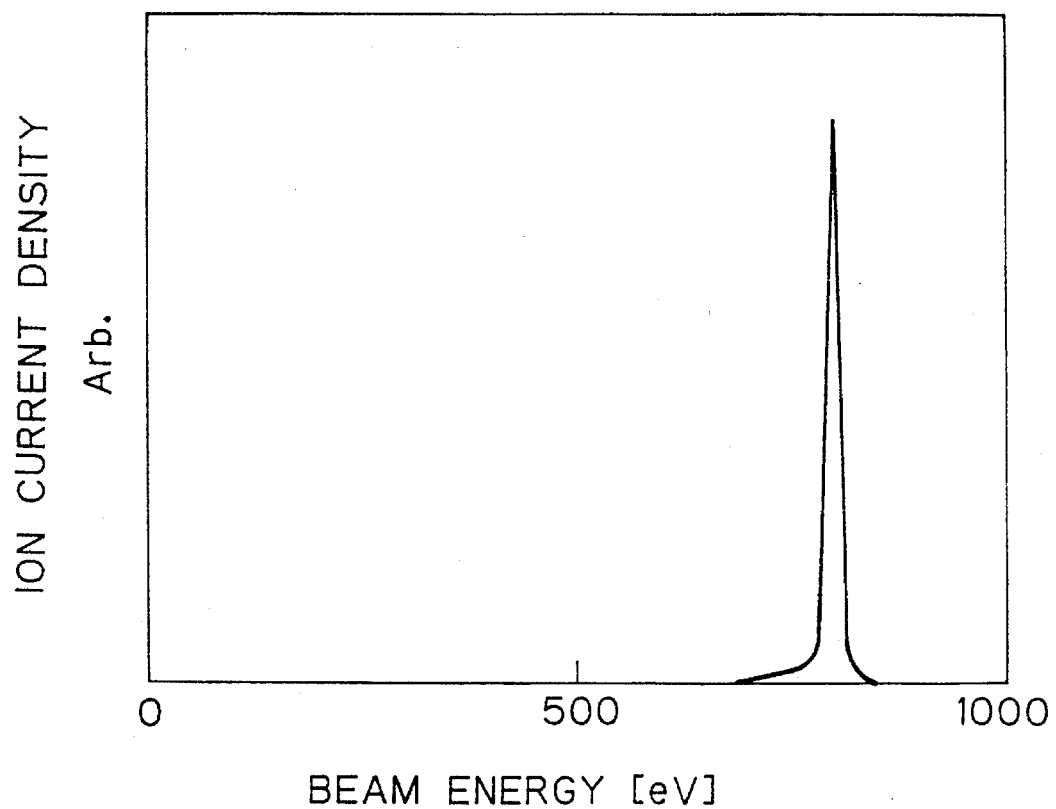
FIG. 2 is a graph showing the relationship between the ion current density and beam energy in the ion source to be used for a surface working of a semiconductor.

Here, for comparison, FIG. 2 shows the energy distribution state of the single energy ion beam used for an ion injection into a semiconductor or a surface fine working of a semiconductor. In such a use, an ion source which will generate gas molecules or a plasma excited species with high kinetic energy of 100 eV to 100 keV is used, and a single energy is required, as much as possible.

Therefore, with an ion beam having such a distribution, the diamond-like carbon film to be obtained by the present invention cannot be formed.

The present invention is now described in detail as follows.

Diamond-like carbon films themselves are known in the art See, e.g., U.S. Pat. No. 4,490,229 to Mirtich et al. The diamond-like carbon film is described below. This film has carbon as the main constituent of the elements thereof, has a hardness similar to natural diamond, is amorphous, and has an electron beam diffraction image exhibiting a halo pattern. In the Raman spectrum, broad peaks inherent to an amorphous structure are exhibited at around 1580 cm$^{-1}$ and 1360 cm$^{-1}$; when the diamond-like carbon film is enlarged by about 10,000 times by a scanning electron microscope and observed, can be seen that it is a uniform and smooth film with no crystal grain. The diamond like carbon film is generally formed by the gas phase synthetic method, using a hydrocarbon compound as the starting material, and contains 40 atom % or less of hydrogen according to the Rutherford scattering analytical method using argon ion, and by penetration hydrogen into the dangling bond of the carbon atoms, whereby the amorphous state is stabilized and the structure is given a high hardness.

The presence of an appropriate amount of hydrogen enables the diamond-like carbon film to exhibit a high hardness similar to diamond, but if the hydrogen content in the film is too high, it becomes a soft organic film. Accordingly, the ratio of hydrogen is up to 35 atom %, preferably 20 to 30 atom %, in the film, when measured by the Rutherford scattering analytical method.

To obtain a hydrogen content in such a range, in the present invention, the intensity and the shape of the magnetic field in the acceleration region of ions, the applied voltage, and the gas pressure are varied to control the characteristics of the ion beam.

Figure 3:
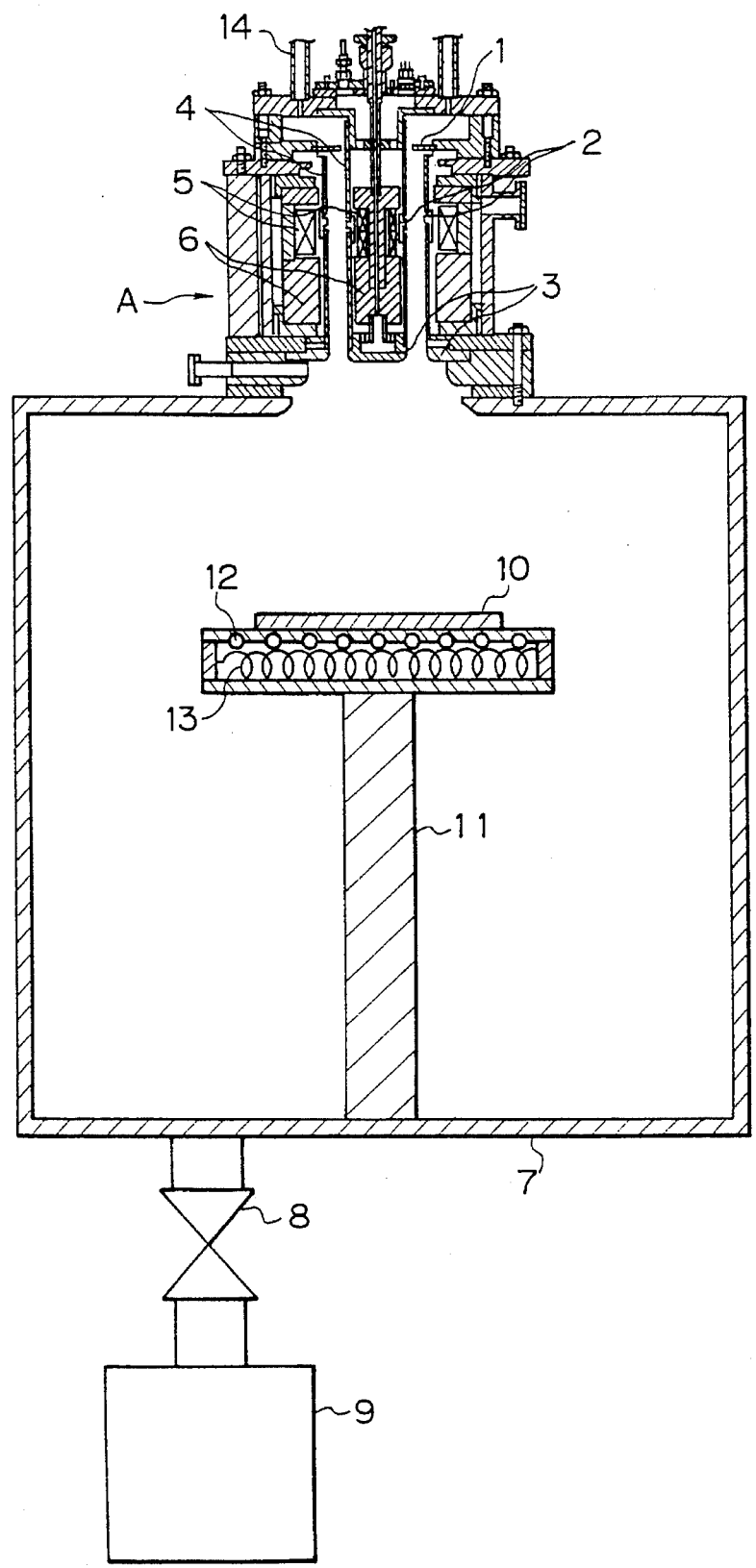
FIG. 3 is a schematic longitudinal sectional view of the HALOC to be used in the present invention.

Next, the structure of the Hall accelerator used as the carbon ion source in the present invention is described. A schematic view of the Hall accelerator ion source which can be used in the present invention is shown in FIG. 3. In the FIG. 1 is an anode, 2 an intermediate electrode, 3 a cathode. When a potential difference of about 0 to 2000 V is applied between the corresponding electrodes in the acceleration region axis direction, an ionization and acceleration of the gas are effected. The acceleration region diametrical direction is the portion surrounded by the coaxial cylindrical insulator 4. The acceleration region is applied with a magnetic field in the radial direction by the electromagnet 5 and a magnetic circuit 6 of ion. Preferably a magnetic field of about 10$^{-2}$ T is applied in the radial direction of the above magnetic circuit when a current of about 1 A is passed through the electromagnet, and therefore, the winding number of the electromagnet is kept within the range satisfying this condition. Since the magnetic circuit and cylindrical insulator are exposed to plasma for a long time, they are forcibly cooled. Numeral 7 is a vacuum chamber which is connected to the evacuation system 9 through the conductance valve 8 and can be brought to a vacuum on the order of 10$^{-6}$ Torr in the system, 10 is the substrate, and 11 is the substrate supporting stand. The substrate can be maintained at a predetermined temperature by the water cooling pipe 12 or the heater 13. Numeral 14 is a gas introducing pipe to which a starting gas for forming the ion beam is fed.

The actuation principle of Hall accelerator is as described below; this has been disclosed by the present inventors as mentioned above.

Since the intensity of the magnetic field in the radius direction of the acceleration region is controlled so as to satisfy:

$r_{Le} \ll L \ll r_{Li}$ $r_{Le}$, $r_{Li}$: Larmor radius of electron and ion

L: Length of magnetic field region, the electrons formed by discharging and the secondary electrons from the cold cathode are captured by the perpendicular magnetic field. Until impinged against a neutral gas, the electrons perform a Trocoid motion with a velocity of E/B, according to the E×B drift to the declination direction. If there is no impingement, the motion in the axis direction is restricted within the range of approximately 2 $r_{Le}$, whereby the residence time of electrons in the acceleration region becomes longer. Therefore, the space charges with the electrons have the effect of neutralizing the positive space charges of ions, and thus a large current not restricted by space charges can be obtained. On the other hand, the ions formed by an impinging ionization between electrons and neutral gas will not be greatly deflected by the magnetic field for the previous inequality formula, and are accelerated by the static charges and withdrawn externally of the ion source as the ion beam from the hollow type cathode.

Based on the actuation principle as described above, the Hall accelerator ion source has the actuation characteristics as show below, and the present invention makes use of these characteristics for the formation of a diamond-like carbon film.

(1) Since no filament is used for ion generation, a withdrawal of a reactive ion beam is possible. Accordingly, a gas capable of a chemical etching as a pre-treatment to coating, such as oxygen, chlorine, and fluorine, can be ionized and irradiated, whereby the cleaning of the substrate can be enhanced.

(2) The formation and acceleration of ions are performed in the same space.

(3) An ion current with a large current can be withdrawn without a restriction in space charges as in a conventional ion source.

(4) Since the ion beam is withdrawn with an energy corresponding to the potential at the generation point in the acceleration region, the withdrawn ion beam has an energy distribution.

(5) By varying the intensity and the shape of the magnetic field in the acceleration region, the applied voltage and the gas pressure, the state of the captured electrons can be varied, whereby the characteristics of discharging and ion beam can be controlled.

The running method operating of the device according to the procedure of forming a diamond-like carbon film after cleaning the substrate surface by an irradiation of an oxygen ion beam on the substrate, is described in detail with reference to the drawings. First, the ion source A and the vacuum chamber 7 are brought to a vacuum on the order of 10$^{-6}$ Torr. Then, by passing a current of 0.5 A through the electromagnet 5 in the magnetic circuit 6, the magnetic field intensity within the discharging space is set at 5×10$^{-3}$ T. When oxygen gas is permitted to flow through the gas introducing pipe 14, to bring the pressure within the ion source to 10$^1$ Torr or higher, and an application of a voltage to the intermediate electrode 2 is gradually elevated, a plasma will be generated within the acceleration region at about 600 V. Thereafter, the oxygen flow rate is reduced, and the conductance valve 8 is controlled to set the pressure within the ion source A at 5×10$^{-2}$ Torr. At this time, if the discharged current between the electrodes within the ion source A is maintained at about 1A, the potential difference between the intermediate electrode 2 and the cathode 3, i.e., the discharging voltage, becomes 600 to 650 V. At this time, the substrate 10 is earthed or a negative voltage of 1000 V or lower is applied to the substrate 10. The running state as described above can be maintained for any desired time, but for cleaning the substrate 10 having, for example, a metal surface, when the ion source-substrate distance is 500 mm or shorter, operating for one hour is sufficient.

Next, while gradually reducing the oxygen gas flow rate from the gas introducing pipe 14 and gradually increasing the flow rate of a gas comprising a hydrocarbon compound, for example, methane gas, the pressure within the ion source is set at about $3.5\times10^{-3}$ Torr, and then the introduction of oxygen is stopped. Accordingly, a change-over to a methane ion beam can be made while maintaining the plasma within the ion source as such, and the step of restarting the plasma can be omitted.

Next, by passing a current of 1.0 A through the electromagnet 5, the magnetic field intensity within the discharging space is set at $1\times10^{-2}$ T. At this time, when the discharging voltage of the ion source is within the range of 900 to 1100 V, the substrate potential is preferably about −300 V, and the ion source-substrate distance is preferably 100 mm to 500 mm, whereby it becomes possible to form a diamond-like carbon film. Under the above conditions, the film forming speed when the ion source-substrate distance is 200 mm is about 1 μm/h, and the procedure may be performed for any desired time corresponding to the ion source-substrate distance set and the desired film thickness. An irradiation with an oxygen ion beam before the film formation is effective for removing the oxidized film and contamination on the substrate surface, to thereby enhance the adhesion of the film, but when the substrate is clean, a methane gas may be permitted to flow from the beginning and the plasma started to set the predetermined running conditions.

Although a specific operating method is described above, the pressure within the ion source can be chosen freely over a range of from the order of $10^{-5}$ Torr to the order of $10^{-1}$ Torr. Namely, if the pressure is less than $10^{-5}$ Torr, a discharge within the ion source will not continue, and if the above pressure is over $10^{-1}$ Torr, the ion beam will not reach the substrate. Also, the flow rates of various gases will change depending on the vacuum chamber pressure and the opening extent of the conductance valve. The electromagnet current can be also chosen depending on the properties of the ion beam desired to be obtained. More specifically, in the HALOC, according to the discharging characteristics and the physical amounts distributions within the acceleration region, and directionless ions obtained by glow discharging, a highly oriented ion beam can be formed by magnetron discharging. For example, when the magnetic field is weak, the directionless ion by glow discharging become predominant, and when the magnetic field is strong, the highly oriented ion beam obtained by magnetron discharging becomes predominant. The ion beam energy obtained by magnetron discharging can be controlled by the discharging voltage, and the energy of the ions by a glow discharge by the voltage applied to the substrate, and therefore, it is prefer to control the energy depending on the film quality to be obtained, such as a film with a high adhesion, and a film with a high hardness, etc.

During the coating of a diamond-like carbon film, the substrate potential is set so that the energy of the ions impinged is 100 to 1500 eV, preferably 500 to 1300 eV. For example, with an about 800 eV (energy at the maximum ion current density), the discharging voltage of the ion source when the electromagnet current is 1.0 A, the pressure within the ion source is $3.5\times10^{-3}$ Torr, and the discharging current 1.0 A is within the range of 900 V to 1100 V. At this time, the energy of the ions reaching the substrate have a distribution with 500 eV as the center, and therefore, to cause the central energy of the ions impinged against the substrate to be about 800 eV, a voltage of −300 V is applied to the substrate.

As the starting material for obtaining the diamond-like carbon film, methane has been exemplified, but the various hydrocarbon compounds shown below also can be employed.

[Hydrogen containing compounds]

saturated hydrocarbons methane, ethane, propane, butane, cyclohexane and the like;

unsaturated hydrocarbons: ethylene, propylene, butylene, acetylene, cyclohexene and the like;

aromatic hydrocarbons: benzene, toluene, xylene and the like;

alcohols: methanol, ethanol, propanol, butanol and the like;

ethers: dimethyl ether, methyl ethyl ether and the like;

compounds containing a ketone group: acetone, methyl ethyl ketone, diethyl ketone, acetophenone and the like;

compounds containing a ketene group: dimethyl ketene, phenyl ketene;

compounds containing an acetyl group: acetic acid, acetic anhydride, acetophenone;

ester compounds: methyl acetate, ethyl acetate, isoamyl acetate;

compounds containing an aldehyde group: formaldehyde, acetaldehyde, propionaldehyde.

[Nitrogen containing compounds]

amines: methylamine, ethylamine, isopropylamine, dimethylamine, trimethylamine;

compounds containing a nitrile group: acetonitrile, benzonitrile, acrylonitrile;

compounds containing an amide group: acetamide, nitro group compounds: nitroethane, nitromethane, nitrobenzen, nitropropane;

Oxygen containing compounds: carbon monooxide, carbon dioxide; Peroxides: peracetic acid, t-butylperoxide.

The compounds as mentioned above can be used alone or as a mixture of two or more compounds.

The substrate material to which the present invention can be applied includes various alloy materials, ceramics, and plastics, etc., and among them, the present invention is particularly effective when applied to iron type materials on which a diamond-like carbon film with good adhesiveness can be formed only with difficulty according to the prior art film forming methods. More specifically, there are included pure iron, carbon steel containing a high carbon content, steel materials including commercially available alloy steels such as stainless steel containing primarily chromium, silicon steel containing primarily silicon, etc. and iron type amorphous alloys, and those having other elements injected into the surface of these materials by ion implantation and carburization, etc. Although the surface to be coated with a diamond-like carbon film may have a finished roughness which is not limited, to coat a film with a strong adhesion force, preferably previously adherents such as oil and fat, rust, etc., are removed prior to coating.

Among, among iron type amorphous alloys, amorphous magnetic alloy thin strip is particularly preferable and the following description discloses in detail below how a marked effect can be obtained by coating the surface of the thin strip with a diamond-like carbon film according to the process of the present invention.

An amorphous magnetic alloy thin strip has excellent magnetic characteristics such as a small coercive force, small magnetic distortion, large permeability even under high frequency, and high saturated flux density, etc. The amorphous alloy has an atomic arrangement having no long distance regularity, exhibiting no diffraction line in X-ray diffraction or electron beam diffraction, and has no magnetic anisotropy, which is different from conventional crystalline metals. Particularly, an amorphous magnetic alloy of a transition metal and a semi-metal has excellent characteristics as soft magnetic material, such as a small coercive force, excellent soft magnetism, little magnetic loss, good workability such as thin plate working, and easy preparation, etc. as well as a convenience in use in combination. Among such amorphous magnetic alloys, those containing iron, cobalt, nickel as the transition metal component and silicon, boron, carbon, phosphorus, etc. as the semi-metal component are known and are used with various compositions depending on the purpose. The amorphous magnetic alloy thin strip is prepared by a quenching coagulation according to the melt spinning method as disclosed in U.S. Pat. No. 3,862,658, Japanese Unexamined Patent Publications (Kokai) Nos. 52-133826, 53-53525, etc., and after molding into various shapes such as coil or laminated plate, and an application of a heat treatment, it is provided for use with such as a high frequency transformer, elastic wave filter, choke coil, and magnetic switch, etc.

Further, an amorphous magnetic alloy thin strip either in shape of coil or in shape of plate has been used when laminated, and for a further improvement of the magnetic characteristics in the same shape as such, it is necessary to electrically insulate the respective layers of the amorphous magnetic alloy thin strip laminate and improve the heat dissipation thereof. Accordingly, resin films or metal oxides are employed as the insulating layer, but is cause problems such that the insulating layers may be deteriorated or a superfluous internal stress may be given to the metal thin strip, to thus worsen magnetic characteristics during annealing and thereby lower the heat dissipation.

All of the above problems can be solved by forming a diamond-like carbon film on such an alloy thin strip according to the process of the present invention.

In the present invention, particularly when the amorphous magnetic alloy thin strip is used as the core for generating an electromagnetic field with a varied pulse and a pulse alternate current by a reversing magnetization at a high speed with a large flux variation width, by using a diamond-like carbon film for insulating the thin strips laminate, the performance of the core can be improved without causing deterioration of the magnetic characteristics of the amorphous magnetic alloy itself. For example, when thermal diffusion constants are compared, the amorphous magnetic alloy has a constant of about 0.03 $cm^2/s$, heat-resistant resin about 0.005 $cm^2/s$, and that of diamond-like carbon is about 1.0 $cm^2/s$, and therefore, by using an amorphous magnetic alloy thin band coated with a diamond-like carbon film, the heat dissipation can be improved to thereby inhibit a temperature elevation of the core. Further, since the diamond-like carbon film has a specific resistivity of about $10^{11}$ to $10^{13}$ $\Omega$.cm, by using an amorphous magnetic alloy thin band coated with a diamond-like carbon film as the core, the eddy current loss can be made smaller.

Further, the present invention exhibits an excellent characteristic in that the diamond-like carbon film will not be deteriorated by shape changes or an annealing of the amorphous magnetic alloy thin strip composed mainly of iron.

The diamond-like carbon film, which is an amorphous material, has been thought to have an unstable chemical energy, and suffers a deterioration of both the adhesion and the insulating property when heated to a temperature higher than the film forming temperature, through a liberation of hydrogen and a progress of the transformation into graphite. Nevertheless, the diamond-like carbon film formed according to the ion beam method has an excellent heat resistance, while the structure and physical properties are slightly changed, when the heating temperature becomes about 600° C. in an inert gas atmosphere. Moreover, such a degree of change is in an amount which poses no problem when making the amorphous magnetic alloy thin band coated with the diamond-like carbon film into cores of electrical parts. When heated to a temperature greatly exceeding 600° C., however, a graphitization will occur rapidly regardless of the surrounding atmosphere, and becomes a good conductor of electricity. Accordingly, preferably the temperature when annealing the amorphous magnetic alloy thin band coated with the diamond-like carbon film is lower than 600° C.

Therefore, an annealing temperature range of 200° C. or higher and lower than 600° C., preferably a temperature range of 360° to 560° C., is suitable for the above alloy thin band, as the film quality and adhesion will not be deteriorated by an annealing within this temperature range.

Also, the preparation method of coating the diamond-like carbon film after an annealing of the amorphous alloy thin strip at a desired temperature may be employed. In this case, rather than a heat resistance, other properties such as a transparency, insulatability, and hardness, etc. can be imparted to a full extent to the diamond-like carbon film.

The thickness of the diamond-like carbon film coated on the amorphous magnetic alloy is determined as follows. That is, if the thickness is made less than 10 nm, pinholes are liable to be formed, whereby the insulation between the respective layers cannot be maintained when used for laminated core, which is the main use of the amorphous magnetic alloy. If the thickness is over 100 μm, the internal stress becomes conspicuous, whereby the magnetic characteristics of the amorphous magnetic alloy will be deteriorated. Therefore, the thickness of the diamond-like carbon film is made 10 nm to 100 μm.

EXAMPLES

Example 1

By using a silicon steel plate (Si content 3%) and the HALOC shown in FIG. 3, a diamond-like carbon film was coated under the conditions shown in Table 1 and below.

TABLE 1

| Time min | Gas | Flow rate | Ion source pressure Torr | Discharging voltage | Discharging current | Coil current | Substrate pontential | Substrate temperature |
|---|---|---|---|---|---|---|---|---|
| 120 | $CH_4$ | 3 ml/min | $3.4 \times 10_{-3}$ | 900V | 1.0A | 1.0A | −500V | 300° C. |

As the result, the physical properties and the structure obtained were as follows.

Film thickness: 1.2 μm

Vickers hardness under 10 gf loading: 4500 kgf/mm²
Adhesion of film under scratch test method: $5 \times 10^7$ N/m²

Raman spectrum: broad peaks exhibited at around 1580 cm⁻¹ and around 1360 cm⁻¹

Hydrogen content: 28 atom %

Electron beam diffraction image: Halo pattern in which no distinct diffraction line can be seen.

Example 2

By using SUS 304 as the substrate and the HALOC shown in FIG. 3 a diamond-like carbon film was coated under the conditions shown in Table 2 and below. Ion source-substrate distance 250 mm

TABLE 2

| Time min | Gas | Flow rate | Ion source pressure Torr | Discharging voltage | Discharging current | Coil current | Substrate pontential | Substrate temperature |
|---|---|---|---|---|---|---|---|---|
| 150 | CH₄ | 3 ml/min | $3.5 \times 10^{-3}$ | 980V | 1.0A | 1.0A | −300V | 300° C. |

As the result, the physical properties and the structure obtained were as follows.

Film thickness: 1.5 μm

Vickers hardness under 10 gf loading: 5000 kgf/mm²
Adhesion of film under scratch test method: $3 \times 10^7$ N/m²

Raman spectrum: broad peaks exhibited at around 1570 cm⁻¹ and around 1360 cm⁻¹

Hydrogen content: 27 atom %

Electron beam diffraction image: Halo pattern in which no distinct diffraction line can be seen

Example 3

By using a silicon steel plate (Si content 3%) ion injected with tungsten ions as the substrate and the HALOC shown in FIG. 3, the film formation was conducted under the conditions shown in Table 3 and below. Tungsten ion injection conditions:

Injected into the outermost surface layer at: Energy: 192 keV, Injected amount: $5 \times 10^{16}$ ions/cm² and in addition, at:

Energy: 82 keV, injected amount: $5 \times 10^{15}$ ions/cm².

Ion source-substrate distance 200 mm

As the result, the physical properties and the structure obtained were as follows.

Film thickness: 1.2 μm

Vickers hardness under 10 gf loading: 4500 kgf/mm²

Adhesion of film under the scratch test method: $25 \times 10^7$ N/m²

Raman spectrum: broad peaks exhibited at around 1580 cm⁻¹ and around 1360 cm⁻¹

Hydrogen content: 28 atom %

Electron beam diffraction image: Halo pattern in which no distinct diffraction line can be seen

Example 4

By using a silicon steel plate (Si content 3%) as the substrate and the HALOC shown in FIG. 3, a prior sputtering (previous irradiation of oxygen ion beam) and film formation were conducted under the conditions shown in Table 4 and below. Ion source-substrate distance 200 mm

TABLE 3

| Time min | Gas | Flow rate | Ion source pressure Torr | Discharging voltage | Discharging current | Coil current | Substrate pontential | Substrate temperature |
|---|---|---|---|---|---|---|---|---|
| 120 | CH₄ | 3 ml/min | $3.5 \times 10^{-3}$ | 900V | 1.0A | 1.0A | −500V | 300° C. |

TABLE 4

| Time min | Gas | Flow rate | Ion source pressure Torr | Discharging voltage | Discharging current | Coil current | Substrate pontential | Substrate temperature |
|---|---|---|---|---|---|---|---|---|
| 60 | $O_2$ | 3 ml/min | $5.0 \times 10^{-2}$ | 800V | 1.0A | 0.5A | 0V | 100° C. |
| 120 | $CH_4$ | 3 ml/min | $3.5 \times 10^{-3}$ | 900V | 1.0A | 1.0A | −500V | 300° C. |

As a result, the physical properties and the structure obtained were as follows.

Film thickness: 1.2 μm

Vickers hardness under 10 gf loading: 4500 kgf/mm²

Adhesion of film under the scratch test method: $18 \times 10^7$ N/m²

Raman spectrum: broad peaks exhibited at around 1580 cm⁻¹ and around 1360 cm⁻¹

Hydrogen content: 28 atom %

Electron beam diffraction image: Halo pattern in which no distinct diffraction line can be seen Compared with Example 1, when an oxygen ion beam is previously irradiated, the adhesion of the film is improved by 3-fold or more.

Example 5

By using SUS 304 as the substrate and the HALOC shown in FIG. 3, a previous sputtering (previous irradiation of oxygen ion beam) and film formation were conducted under the conditions shown in Table 5 and below. Ion source-substrate distance 250 mm

TABLE 5

| Time min | Gas | Flow rate | Ion source pressure Torr | Discharging voltage | Discharging current | Coil current | Substrate pontential | Substrate temperature |
|---|---|---|---|---|---|---|---|---|
| 60 | $O_2$ | 3 ml/min | $5.3 \times 10^{-2}$ | 670V | 1.0A | 1.0A | −300V | 100° C. |
| 150 | $CH_4$ | 3 ml/min | $3.5 \times 10^{-3}$ | 980V | 1.0A | 1.0A | −300V | 300° C. |

As the result, the physical properties and the structure obtained were as follows Film thickness: 1.5 μm Vickers hardness under 10 gf loading: 5000 kgf/mm²

Adhesion of film under the scratch test method: $20 \times 10^7$ N/m²

Raman spectrum: broad peaks exhibited at around 1580 cm⁻¹ and around 1360 cm⁻¹

Hydrogen content: 27 atom %

Electron beam diffraction image: Halo pattern in which no distinct diffraction line can be seen Compared with Example 2, when an oxygen ion beam is previously irradiated, the adhesion of the film is improved by 6-fold or more.

Example 6

By using silicon carbide ceramics as the substrate and the HALOC shown in FIG. 3, a prior sputtering (a prior irradiation of oxygen ion beam) and film formation were conducted under the conditions shown in Table 6 and below. Ion source-substrate distance 250 mm

TABLE 6

| Time min | Gas | Flow rate | Ion source pressure Torr | Discharging voltage | Discharging current | Coil current | Substrate pontential | Substrate temperature |
|---|---|---|---|---|---|---|---|---|
| 60 | $O_2$ | 3 ml/min | $5.0 \times 10^{-2}$ | 800V | 1.0A | 0.5A | 0V | 100° C. |
| 120 | $CH_4$ | 3 ml/min | $3.5 \times 10^{-3}$ | 900V | 1.0A | 1.0A | −500V | 300° C. |

As a result, the physical properties and the structure obtained were as follows.

Film thickness: 1.2 μm

Vickers hardness under 10 gf loading: 5500 kgf/mm²

Adhesion of film under the scratch test method: $180 \times 10^7$ /m²

Raman spectrum: broad peaks exhibited at around 1580 cm⁻¹ and around 1360 cm⁻¹

Hydrogen content: 28 atom %

Electron beam diffraction image: Halo pattern in which no distinct diffraction line can be seen.

Example 7

By using a Cardo type polymer sheet as the substrate and the HALOC shown in FIG. 3, a previous sputtering (previous irradiation of oxygen ion beam) and film formation were conducted under the conditions shown in Table 7 and below. Ion source-substrate distance 250 mm

TABLE 7

| Time min | Gas | Flow rate | Ion source pressure Torr | Discharging voltage | Discharging current | Coil current | Substrate pontential | Substrate temperature |
|---|---|---|---|---|---|---|---|---|
| 60 | $O_2$ | 3 ml/min | $5.0 \times 10^{-2}$ | 800V | 1.0A | 0.5A | 0V | 100° C. |
| 120 | $CH_4$ | 3 ml/min | $3.4 \times 10^{-3}$ | 900V | 1.0A | 1.0A | −500V | 300° C. |

As a result, the physical properties and the structure obtained were as follows.

Film thickness: 1.2 mm Pencil hardness: 9H

Raman spectrum: broad peaks exhibited at around 1580 $cm^{-1}$ and around 1360 $cm^{-1}$.

Hydrogen content: 28 atom %

Electron beam diffraction image: Halo pattern in which no distinct diffraction line can be seen

Example 8

By using an amorphous alloy $Fe_{73.5}Si_{13.5}B_9CU_1Nb_3$ (atom %) as the substrate and the HALOC shown in FIG. 3, a previous sputtering (previous irradiation of oxygen ion beam) and film formation were conducted under the conditions shown in Table 8 and below. Ion source-substrate distance 250 mm

TABLE 8

| Time min | Gas | Flow rate | Ion source pressure Torr | Discharging voltage | Discharging current | Coil current | Substrate pontential | Substrate temperature |
|---|---|---|---|---|---|---|---|---|
| 60 | $O_2$ | 3 ml/min | $5.0 \times 10^{-2}$ | 800V | 1.0A | 0.5A | 0V | 100° C. |
| 120 | $CH_4$ | 3 ml/min | $7.0 \times 10^{-3}$ | 750V | 1.0A | 1.0A | −300V | 300° C. |

As a result, the physical properties of and the structure of the film became as follows.

Film thickness: 1.3 μm

Raman spectrum: broad peaks exhibited at around 1580 $cm^{-1}$ and around 1360 $cm^{-1}$ Hydrogen content 29 atom %

Electron diffraction image: Halo pattern in which no distinct diffraction line can be seen.

Example 9

By using pure Iron as the substrate and the HALOC shown in FIG. 3, a diamond-like carbon film was coated under the conditions shown in Table 9 and below. Ion source-substrate distance 250 mm

TABLE 9

| Time min | Gas | Flow rate | Ion source pressure Torr | Discharging voltage | Discharging current | Coil current | Substrate pontential | Substrate temperature |
|---|---|---|---|---|---|---|---|---|
| 120 | $CH_4$ | 3 ml/min | $3.5 \times 10^{-3}$ | 950V | 1.0A | 1.0A | −300V | 300° C. |

As a result, the physical properties and the structure of the film became as follows.

Film thickness: 1.2 μm, 10 gf loading Vickers hardness: 4300 $kgf/mm^2$,

Adhesion of film under the scratch test method: $1 \times 10^7 /m^2$

Raman spectrum: broad peaks exhibited at around 1580 $cm^{-1}$ and around 1360 $cm^{-1}$ Hydrogen content 28 atom %

Electron diffraction image: Halo pattern in which no distinct diffraction line can be seen.

Example 10

By using s carbon steel (S45C) as the substrate and the HALOC shown in FIG. 3, a diamond-like carbon film was coated under the conditions shown in Table 10 and below. In source-substrate distance 250 mm

TABLE 10

| Time min | Gas | Flow rate | Ion source pressure Torr | Discharging voltage | Discharging current | Coil current | Substrate pontential | Substrate temperature |
|---|---|---|---|---|---|---|---|---|
| 120 | $CH_4$ | 3 ml/min | $3.5 \times 10^{-3}$ | 980V | 1.0A | 1.0A | −300V | 300° C. |

As a result, the physical properties of and the structure of the film became as follows.

Film thickness: 1.3 μm, 10 gf loading Vickers hardness: 500 kgf/mm$^2$,

Adhesion of film under the scratch test method: $3 \times 10^7$ N/m$^2$,

Raman spectrum: broad peaks exhibited at around 1580 cm$^{-1}$ and around 1360 cm$^{-1}$, Hydrogen content 27 atom %

Electron diffraction image: Halo pattern in which no distinct diffraction line can be seen.

Example 11

According to the composition ratios shown in Table 11, the respective starting materials were weighed respectively, melted in an argon gas, atmosphere and thereafter, quenched to prepare three kinds of matrix alloys. Next, the respective matrix alloys were quenched according to the melt spin method at a cooling rate of 10$^6$.C/S from 1300° C., to prepare a thin band with a thickness of 20 μm and a width of 50 mm.

Next, by using the HALOC shown in FIG. 3, at an ion source-substrate distance of 200 mm, under the conditions shown in Table 10, three kinds of amorphous magnetic alloy thin bands were coated with a diamond-like carbon film.

As a result, not only the thin strip portion with a thickness of 50 mm, but also the thin band side brim portion with a thickness of about 20 μm was coated with the diamond-like carbon film. The physical properties and the structure of the diamond-like carbon film coated became as follows.

Film thickness: 1.2 μm, 10 gf loading Vickers hardness: 5000 kgf/mm$^2$.

In the adhesion test with a Cellophane tape, no defect was found in each sample.

Adhesion of film under the scratch test method: $20 \times 10^7$ N/m$^2$,

Raman spectrum: broad peaks exhibited from 1100 cm$^{-1}$ to 1700 cm$^{-1}$.

Hydrogen content: 30 atom %

Specific resistivity $1 \times 10^{11}$ Ω.cm.

Electron diffraction image: Halo pattern in which no distinct diffraction line can be seen.

The magnetic characteristics of the amorphous magnetic alloy thin band before and after coating with the diamond-like carbon film were as shown in Table 11.

TABLE 11

| Material composition | Thickness (μm) | Saturated (T) | flux Rectangular ratio (%) | Coercive force (A/m) | Specific permeability (1 kHz) | Core loss (dW/m$^2$) | Specific resistivity of diamond-like carbon film (Ωcm) |
|---|---|---|---|---|---|---|---|
| $Fe_{73.5}Si_{13.5}B_9Cu_1Nb_3$ | 20 | 1.3 | 56 | 13.0 | 350 | 1600 | $1 \times 10^{11}$ |
| Carbon film coated on the above | 22 | 1.3 | 66 | 10.1 | 1000 | 1200 | |
| $Co_{72}Fe_8Si_{11}B_1Ni_3Nb_5$ | 20 | 0.5 | 60 | 1.4 | 6000 | 900 | $1 \times 10^{11}$ |
| Carbon film coated on the above | 22 | 0.5 | 68 | 0.8 | 11000 | 560 | |
| $Fe_{80.5}Si_{6.5}B_{12}C_1$ | 20 | 1.6 | 50 | 11.0 | 280 | 7000 | $1 \times 10^{11}$ |
| Carbon film coated on the above | 22 | 1.6 | 70 | 5.8 | 1500 | 4000 | |

TABLE 12

| Time min | Gas | Flow rate | Ion source pressure Torr | Discharging voltage | Discharging current | Coil current | Substrate pontential | Substrate temperature |
|---|---|---|---|---|---|---|---|---|
| 120 | $CH_4$ | 3 ml/min | $3.4 \times 10^{-3}$ | 900V | 1.0A | 1.0A | −500V | 300° C. |

Next, the above three kinds of amorphous magnetic alloy thin strips coated with the diamond-like carbon film were annealed respectively under the annealing conditions shown in FIG. 13(1) for one hour. As a result, the physical properties and the structure of the diamond-like carbon film were found to be as follows.

Film thickness: 1.2 μm, 10 gf loading Vickers hardness: 4500 kgf/mm$^2$.

In the adhesion test by a Cellophane tape, no defect was found in each sample.

Adhesion of film under the scratch test method: $20 \times 10^7$ /m$^2$.

Raman spectrum: broad peaks exhibited from 1100 cm$^{-1}$ to 1700 cm$^{-1}$.

Hydrogen content: 28 atom %

Electron diffraction image: Halo pattern in which no distinct diffraction line can be seen.

Figure 4:
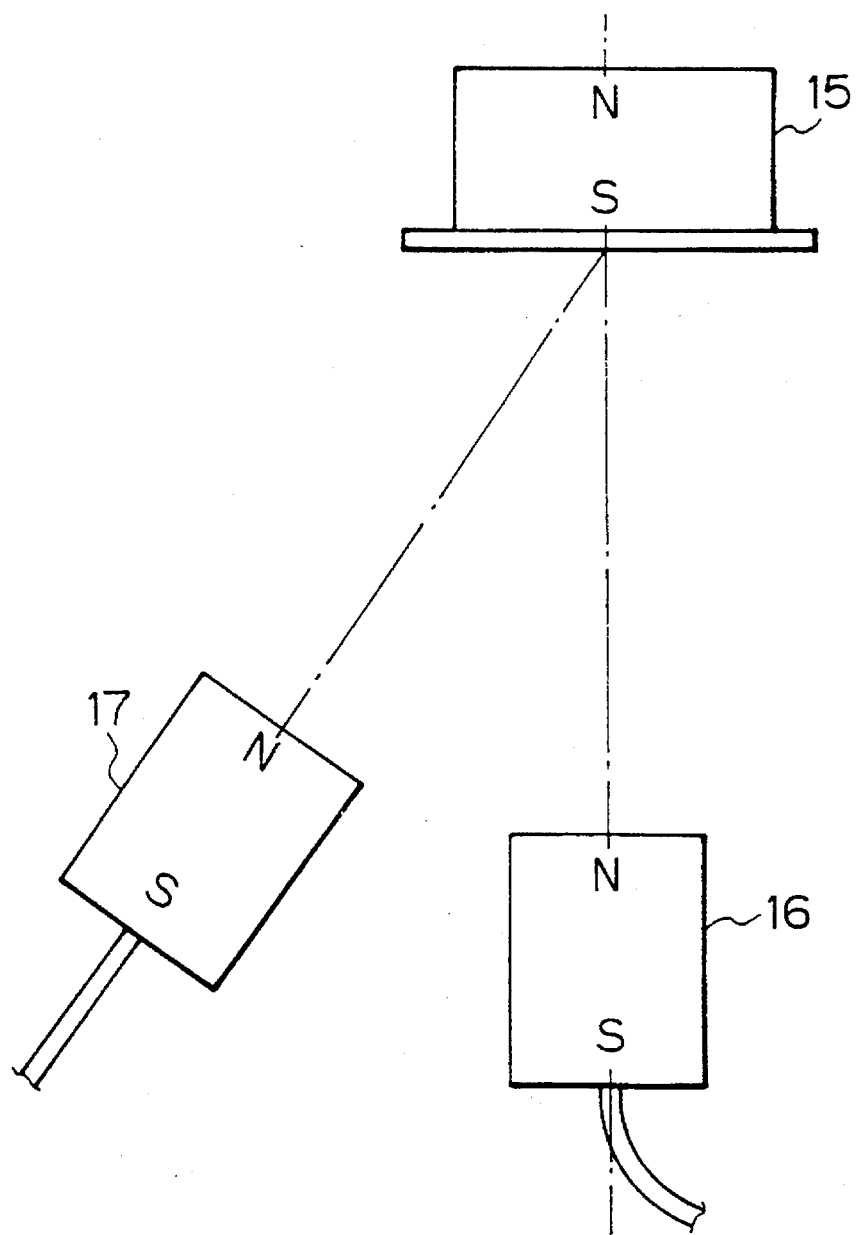
FIG. 4 is a schematic view of the device for forming a diamond-like carbon film by using the Kaufman type ion source.

The various magnetic characteristics and thermal characteristics of the amorphous magnetic alloy thin strips coated with the diamond-like carbon film prepared by a hole accelerator ion source were measured, and compared with the magnetic characteristics of the amorphous magnetic alloy thin strip not coated with a diamond-like carbon film, to obtain the results shown in Table 13(1) and (2). From these results it is evident that the diamond-like carbon film can be used as an insulating layer having a thermal good conductivity which can with stand an annealing temperature substantially without a change of the magnetic characteristics such as the rectangular ratio, permeability, and core loss, etc.

source under the conditions of an ion current density of 1.2 mA/cm$^2$ and a beam energy of 200 ev. As shown in FIG. 4, the menthane ion source 16 was arranged at 80 mm below the substrate 15, and the hydrogen ion source 17 at an incident angle of 48 and a distance of 90 mm to the substrate 15. The intensity of the magnetic field was $4.7 \times 10^{-2}$ T: N pole at the methane on source outlet, $1.0 \times 10^{-2}$ T: N pole, and $4.5 \times 10^{-2}$ T:S at the substrate position.

The physical properties and the structure of the diamond-like carbon film obtained by the film formation for 150 minutes became as follows.

Film thickness 1.5 μm, 10 gf loading Vickers hardness: 5000 kgf/mm$^2$

Adhesion of the film according to the scratch test method: $5 \times 10^5$ m$^2$ Raman spectrum: broad peaks exhibited at around 1580 cm$^{-1}$ and around 1360 cm$^{-1}$ Hydrogen content 26 atom %

Electron diffraction image: Halo pattern in which no distinct diffraction line can be seen.

TABLE 13 (1)

| Material composition | Thickness (μm) | Annealing conditions (°C.) | Saturated flux (T) | Rectangular ratio (%) | Coercive force (A/m) | Specific permeability (1 kHz) |
| --- | --- | --- | --- | --- | --- | --- |
| Fe$_{73.5}$Si$_{13.5}$B$_9$Cu$_1$Nb$_3$ | 20 | 550 | 1.3 | 89 | 0.8 | 5500 |
| Carbon film coated on the above | 22 | 550 | 1.3 | 89 | 0.8 | 5000 |
| Co$_{72}$Fe$_3$Si$_{11}$B$_1$Ni$_3$Nb$_5$ | 20 | 450 | 0.5 | 97 | 0.56 | 50000 |
| Carbon film coated on the above | 22 | 450 | 0.5 | 97 | 0.56 | 45000 |
| Fe$_{80.5}$Si$_{6.5}$B$_{12}$C$_1$ | 20 | 360 | 1.6 | 95 | 3.2 | 2000 |
| carbon film coated on the above | 22 | 360 | 1.6 | 85 | 3.5 | 1800 |

TABLE 13 (2)

| Material composition | Core loss (kW/m$^3$) | Specific resistivity of diamond-like carbon film (Ωcm) | Thermal diffusion ratio of whole sample (cm$^2$/s) |
| --- | --- | --- | --- |
| Fe$_{73.5}$Si$_{13.5}$B$_9$Cu$_1$Nb$_3$ | 950 | | 0.0242 |
| Carbon film coated on the above | 950 | $5 \times 10^3$ | 0.0935 |
| Co$_{72}$Fe$_3$Si$_{11}$B$_1$Ni$_3$Nb$_5$ | 320 | | 0.0254 |
| Carbon film coated on the above | 320 | $2 \times 10^{10}$ | 0 1058 |
| Fe$_{80.5}$Si$_{8.5}$B$_{12}$C$_1$ | 3200 | | 0.0232 |
| Carbon film coated on the above | 3800 | $1 \times 10^{11}$ | 0.0758 |

Comparative example 1

By using SUS 304 as the substrate, a diamond-like carbon film was formed while irradiating a methane beam on the substrate by using a Kaufman type ion source under the conditions of a film forming chamber pressure of $1 \times 10^{-3}$ Torr, a substrate temperature of 300° C., a beam energy of 800 eV, and an ion current density of 0.5 mA/cm$^2$, and at the same time, irradiating a hydrogen ion beam on the same position of the substrate from another Kaufman type ion Comparative example 2

SUS 304 was employed as the substrate and a quartz reaction tube of 100 mm in inner diameter was vertically held, than H$_2$ 50 sccm, CH$_4$ 50 sccm as the reaction gases were fed from above, and a non-polar discharging was generated under the conditions of a reaction pressure of 35 Torr, 2.45 GHz, a microwave oscillator output of 500 W, to excite the gas, and a the same time the substrate temperature was maintained at 200° C. for 5 hours to form a diamond-like carbon film.

As a result, the physical properties and the structure of the diamond-like carbon film obtained became as follows.

Film thickness 1.5 μm, 10 gf loading Vickers hardness: 3500 kgf/mm$^2$

Adhesion of the film according to the scratch test method: $5 \times 10^4$ N/m$^2$ Raman spectrum: broad peaks exhibited at around 1580 cm$^{-1}$ and around 1360 cm$^{-1}$ Hydrogen content 27 atom %

Electron diffraction image: Halo pattern in which no distinct diffraction line can be seen.

We claim:

1. A process for coating a substrate surface with a diamond-like carbon film, which comprises introducing a starting material gas comprising a hydrocarbon compound into a Hall accelerator ion source, wherein said ion source has an acceleration region surrounded by a coaxial cylindrical insulator without a filament, and has an electric field which is formed by an anode and a cathode, said anode and said cathode are established at opposite ends of the cylindrical insulator, and has a magnetic field in a radial direction forming a magnetic field region in which a length of the magnetic field region is larger than a Larmor radius of electrons and is smaller than a Larmor radius of ions, in the acceleration region, and ionization and acceleration of gas take place in the acceleration region, forming an ion beam of said starting material gas in said ion source, irradiating the ion beam onto the substrate surface in a vacuum chamber, with an energy distribution of 80% or more of the ions irradiated on the substrate surface having an energy over a range of 100 to 1500 eV, wherein ions are present having energies continuously covering an energy range of 500 eV to 1000 eV, thereby coating said substrate surface with said diamond-like carbon film.

2. A process according to claim 1, wherein the ion beam of said starting material gas is irradiated onto said substrate surface after an ion beam of a gas for chemical etching is irradiated onto the substrate.

3. A process according to claim 1, wherein the substrate comprises at least one material selected from the group consisting of pure iron, carbon steel, stainless steel, silicon steel and an amorphous magnetic alloy.

4. A process according to claim 3, wherein annealing is applied to the substrate comprising said amorphous magnetic alloy at a temperature of 200° to 590° C.

5. A process according to claim 3, wherein annealing is applied at a temperature of 200° to 590° C. after a diamond-like carbon film is formed on the substrate comprising said amorphous magnetic alloy.

6. A process according to claim 1, wherein said ion source has an inner pressure and said ion source inner pressure is set in the range of $1 \times 10^{-5}$ to $1 \times 10^{-1}$ Torr.

7. A process according to claim 1, wherein the starting material gas is at least a hydrogen containing compound and nitrogen containing compound containing carbon atoms.

8. A process according to claim 2, wherein said substrate is a material selected from a group consisting of iron and iron alloy and wherein said gas for chemical etching is oxygen.

9. A process according to claim 8, wherein said substrate is stainless steel.

10. A process for coating a substrate surface with a diamond-like carbon film, which comprises introducing a starting material gas comprising a hydrocarbon compound into a Hall accelerator ion source, wherein said ion source has an acceleration region surrounded by a coaxial cylindrical insulator without a filament, and has an electric field which is formed by an anode and a cathode, said anode and said cathode are established at opposite ends of the cylindrical insulator, and has a magnetic field in a radial direction forming a magnetic field region in which a length of the magnetic field region is larger than a Larmor radius of electrons and is smaller than a Larmor radius of ions, in the acceleration region, and ionization and acceleration of gas take place in the acceleration region, said ion source having an inner pressure and said starting material gas is introduced therein while reducing the inner pressure of said ion source to between $1 \times 10^{-5}$ to $1 \times 10^{-1}$ Torr.

forming an ion beam comprising ions in which 80% or more of the ions formed have an impinging energy distribution over a range of 100 to 1500 eV, wherein ions are present having energies continuously covering an energy range of 500 eV to 1000 eV, irradiating the ion beam onto the substrate surface in a vacuum chamber, thereby coating said substrate surface with said diamond-like carbon film.

11. A process according to claim 10, wherein the ion beam of said starting material gas is irradiated onto said substrate surface after an ion beam of a gas for chemical etching is irradiated onto the substrate surface.

12. A princess according to claim 11, wherein said substrate is a material selected from a group consisting of iron and iron alloy and wherein said gas for chemical etching is oxygen.

13. A process according to claim 12, wherein said substrate is stainless steel.

* * * * *